United States Patent [19]

Chou et al.

[11] Patent Number: 5,565,700
[45] Date of Patent: Oct. 15, 1996

[54] SURFACE COUNTER DOPED N-LDD FOR HIGH CARRIER RELIABILITY

[75] Inventors: Jih W. Chou; Joe Ko; Chun Y. Chang, all of Hsinchu, Taiwan

[73] Assignee: United Microelectronics Corporation, Hsin-chu City, Taiwan

[21] Appl. No.: 426,491

[22] Filed: Apr. 20, 1995

Related U.S. Application Data

[60] Continuation of Ser. No. 195,092, Feb. 14, 1994, abandoned, which is a division of Ser. No. 94,990, Jul. 22, 1993, Pat. No. 5,308,780.

[51] Int. Cl.$^6$ ............ H01L 29/76; H01L 29/94; H01L 31/062; H01L 31/113
[52] U.S. Cl. ............ 257/408; 257/336; 257/340; 257/344; 257/346
[58] Field of Search ............ 257/408, 336, 257/344, 340, 346

[56] References Cited

U.S. PATENT DOCUMENTS

| | | | |
|---|---|---|---|
| 4,771,012 | 9/1988 | Yabu et al. | 437/29 |
| 4,894,694 | 1/1990 | Cham et al. | 257/344 |
| 5,073,514 | 12/1991 | Ito et al. | 437/44 |
| 5,147,811 | 9/1992 | Sakagami | 437/35 |
| 5,158,901 | 10/1992 | Kosa et al. | 437/40 |
| 5,362,982 | 11/1994 | Hirase et al. | 257/408 |

*Primary Examiner*—Steven H. Loke
*Attorney, Agent, or Firm*—William H. Wright

[57] ABSTRACT

A new surface counter-doped lightly doped source and drain integrated circuit field effect transistor device is described. A gate silicon oxide layer is formed on the silicon substrate. A layer of polysilicon is deposited over the gate silicon oxide layer and etched to form a gate electrode structure. A first ion implantation is performed at a tilt angle to form lightly doped drain regions in the semiconductor substrate wherein the lightly doped drain regions are partially overlapped by the gate electrode structure. A second ion implantation is performed at a larger tilt angle and lower energy than the first ion implantation wherein the second ion implantation counter-dopes the surface of the lightly doped drain regions to form a very lightly doped drain layer thus making the lightly doped drain regions buried regions. A thin layer of silicon oxide is deposited over the surface of the polysilicon gate electrode structure and is anisotropically etched to form ultra thin spacers on the sidewalls of the polysilicon gate electrode structure. A third ion implantation is performed with no tilt angle to complete formation of the lightly doped drain regions. A glasseous layer is deposited over all surfaces of the substrate and flowed followed by metallization and passivation to complete manufacture of the integrated circuit.

11 Claims, 5 Drawing Sheets

5,565,700

SURFACE COUNTER DOPED N-LDD FOR HIGH CARRIER RELIABILITY

This is a continuation of application Ser. No. 08/195,092, filed Feb. 14, 1994 and now abandoned, which was a divisional of application Ser. No. 08/094,990, filed Jul. 22, 1993 and now U.S. Pat. No. 5,308,780.

BACKGROUND OF THE INVENTION (1) Field of the Invention

The invention relates to the fabrication of integrated circuit devices, and more particularly, to a method of forming surface counter-doped lightly doped drain regions in the fabrication of integrated circuits.

(2) Description of the Prior Art

Hot carrier effects resulting from high electric fields cause the most severe reliability problems in ULSI (ultra large scale integrated circuit) MOSFET devices. A lightly doped source and drain structure can effectively reduce the electric field, but this advantage is often accompanied by spacer-induced degradation. High driving current or transconductance degradation due to hot carrier damages are observed after electric stress.

Large tilt-angle implanted drain (LATID) processes have been used by a number of workers in the art to form lightly doped drains. U.S. Pat. No. 5,073,514 to Ito et al discloses the formation of an lightly doped source and drain MOSFET using LATID to form the N− and then used vertical ion implantation to form the N+ region. U.S. Pat. No. 5,147,811 to Sakagami describes the formation of a P region under the gate using LATID and then a vertical ion implant to form the N+ source/drain regions. U.S. Pat. Nos. 5,158,901 to Kosa et al and 4,771,012 to Yuba et al describe other methods of LATID.

SUMMARY OF THE INVENTION

A principal object of the present invention is to provide an effective and very manufacturable method of forming a lightly doped drain.

Another object of the present invention is to provide a method of forming a lightly doped drain which improves hot carrier reliability.

In accordance with the objects of this invention the method of forming an integrated circuit field effect transistor with surface counter-doped lightly doped drain regions is achieved. A gate silicon oxide layer is formed on the silicon substrate. A layer of polysilicon is deposited over the gate silicon oxide layer and etched to form a gate electrode structure. A first ion implantation is performed at a tilt angle to form lightly doped drain regions in the semiconductor substrate wherein the lightly doped drain regions are partially overlapped by the gate electrode structure. A second ion implantation is performed at a larger tilt angle and lower energy than the first ion implantation wherein the second ion implantation counter-dopes the surface of the lightly doped drain regions to form a very lightly doped drain layer thus making the lightly doped drain regions buried regions. A thin layer of silicon oxide is deposited over the surface of the polysilicon gate electrode structure and is anisotropically etched to form ultra thin spacers on the sidewalls of the polysilicon gate electrode structure. A third ion implantation is performed with no tilt angle to complete formation of the lightly doped drain regions. A glasseous layer is deposited over all surfaces of the substrate and flowed followed by metallization and passivation to complete manufacture of the integrated circuit.

BRIEF DESCRIPTION OF THE DRAWINGS

In the accompanying drawings forming a material part of this description, there is shown.

DESCRIPTION OF THE PREFERRED EMBODIMENTS

FIGS. 1 through 6 illustrate an N channel MOSFET integrated circuit device. However, it is well understood by those skilled in the art that a P channel FET integrated circuit device could be formed by simply substituting opposite polarities to those given for the N channel embodiment. Also, in a similar way, a CMOSFET could be formed by making both N channel and P channel devices upon the same substrate.

Figure 1:
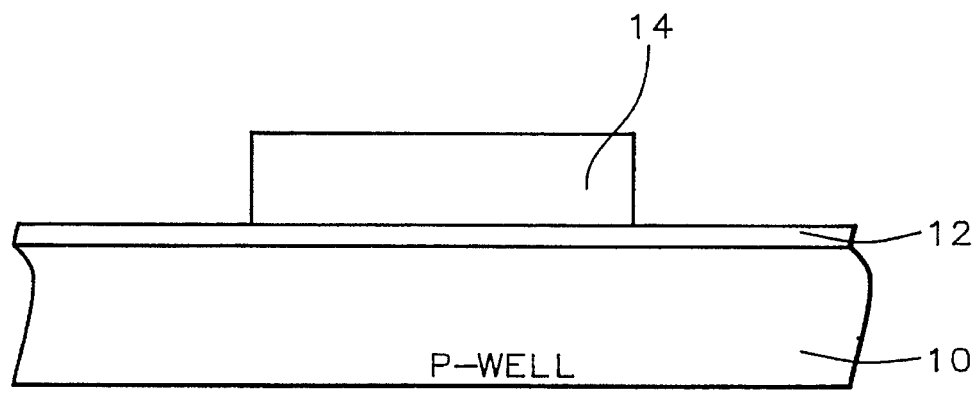
FIGS. 1 through 6 schematically illustrate in cross-sectional representation one preferred embodiment of this invention.

Referring now more particularly to FIG. 1, there is shown an illustration of a portion of a partially completed integrated circuit in which there is a monocrystalline semiconductor substrate 10. The surface of the silicon substrate 10 is thermally oxidized to form the desired gate oxide 12. This layer is between about 30 to 200 Angstroms in thickness.

The polysilicon layer 14 is deposited by low pressure chemical vapor deposition (LPCVD) and doped by phosphorus ion implant. This layer has a preferred thickness of between about 1000 to 4000 Angstroms. The polysilicon layer 14 is etched to form gate electrode structures. Gate lengths are from between about 0.1 to 5 micrometers.

Figure 2:
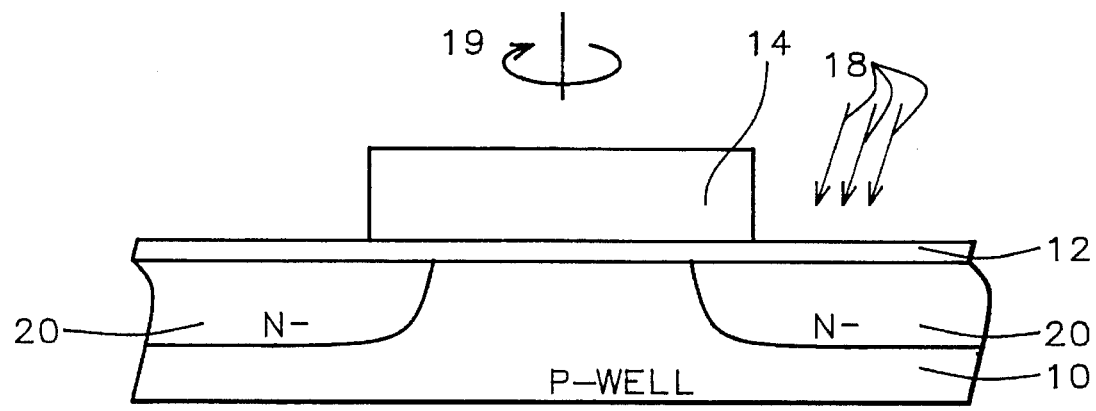

FIG. 2 illustrates the LATID process of implanting phosphorus ions 18 at an energy of between about 30 to 60 Kev and a dosage of between about 1 E 13 to 4 E 13 atoms/cm$^2$ with a tilt angle of between about 30° to 45°. This forms the N− lightly doped source and drain regions 20. 19 illustrates the rotation of the wafer during ion implantation. The wafer rotates at 0.2 to 2 rotations per second for 5 to 10 seconds so as to achieve a symmetrical N− lightly doped source and drain structure.

Figure 3:
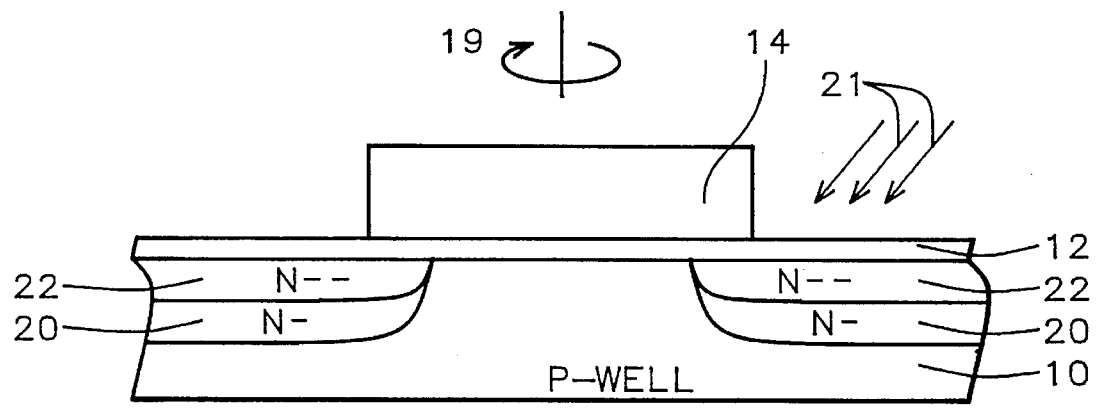
Figure 4:
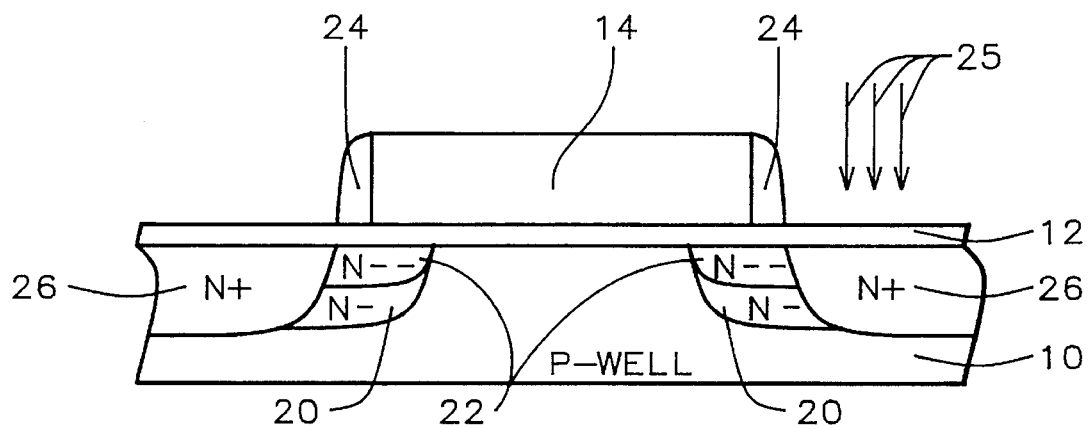

Referring to FIG. 3, an additional BF$_2$ is implanted 21 at the same or lower dosage than that used for the LATID implant, but with a lower energy of between about 20 to 40 Kev and a larger tilt angle of between about 30° to 60°. This counter-dopes the surfaces of the N− regions 20 to form an even lighter layer 22, thus making the N− regions 20 buried N− lightly doped source and drain regions. The wafer is rotated 19 during this implantation in the same way it was rotated during the first implantation.

In order to implement a fully overlapped gate and drain structure, a thin layer of silicon oxide is deposited by chemical vapor deposition to a thickness of between about 1000 to 2500 Angstroms. This layer is etched with a rapid reactive ion etch to form ultra thin sidewall spacers 24, seen in FIG. 4. These spacers are between about 500 to 2000 Angstroms in width. Then, arsenic ions are implanted 25 at a dosage of between about 1 E 15 to 1 E 16 atoms/cm$^2$ at energy levels of 30 to 100 Kev at a 0° or a 7° tilt angle to form N+ regions 26.

Figure 5:
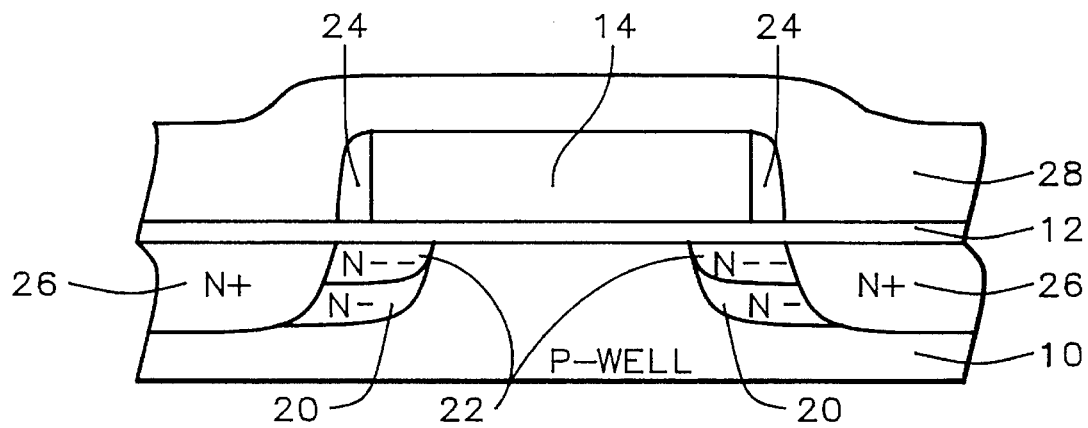

Referring now to FIG. 5, an insulating layer, such as borophosphosilicate glass (BPSG) 28 is deposited over all surfaces of the wafer and reflowed at 800° to 1000° C. for 30 seconds to 90 minutes. The following thermal cycles are limited to restrict lateral diffusion so that the final source/drain junction depth is between about 0.1 to 0.35 micrometers.

Figure 6:
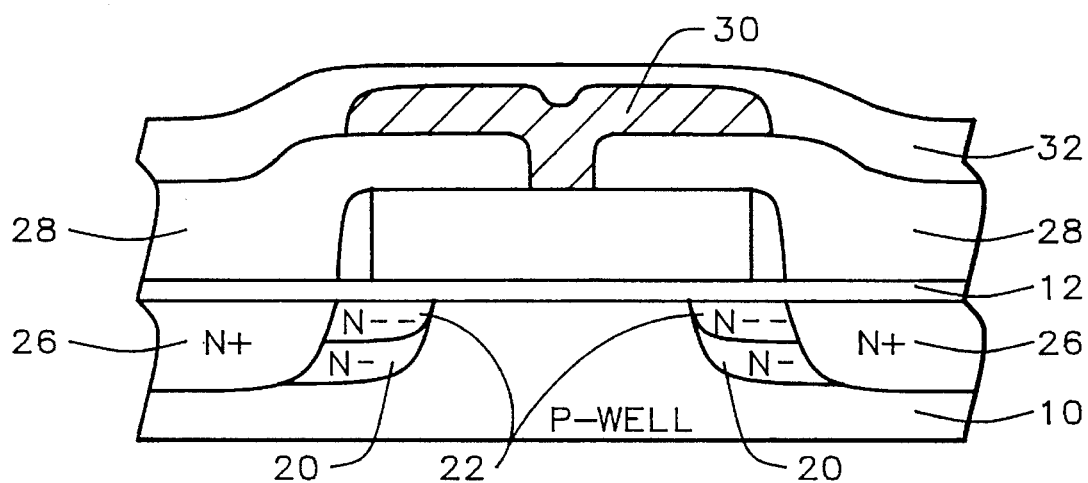

Referring now to FIG. 6, processing continues to make contact openings through the insulating layer 28 to the gate electrode 14. Metallization 30 and passivation layer 32 complete the fabrication of the integrated circuit.

In this invention, by using large tilt angle implant technique, the novel structure surface counter-doped buried lightly doped drain is introduced, using a larger tilt angle and lower energy $BF_2$ implant to counter-dope the surface N– region. The purpose of this $BF_2$ surface implant is to lower the surface concentration of the N– lightly doped drain region to form a buried N– drain. It suppresses the lateral maximum electric field deeper into the silicon substrate and separates the drain current path away from the maximum electric field region.

Figure 7A:
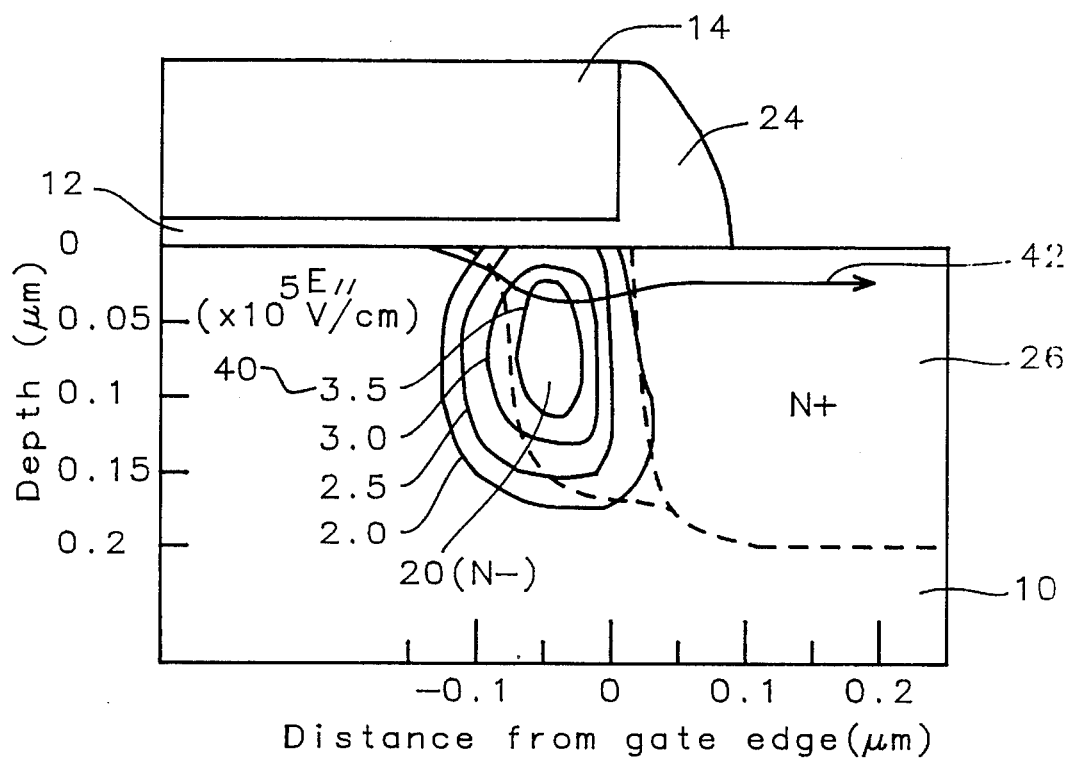
FIG. 7A schematically represents in cross-sectional representation a lightly doped drain of the prior art.
Figure 7B:
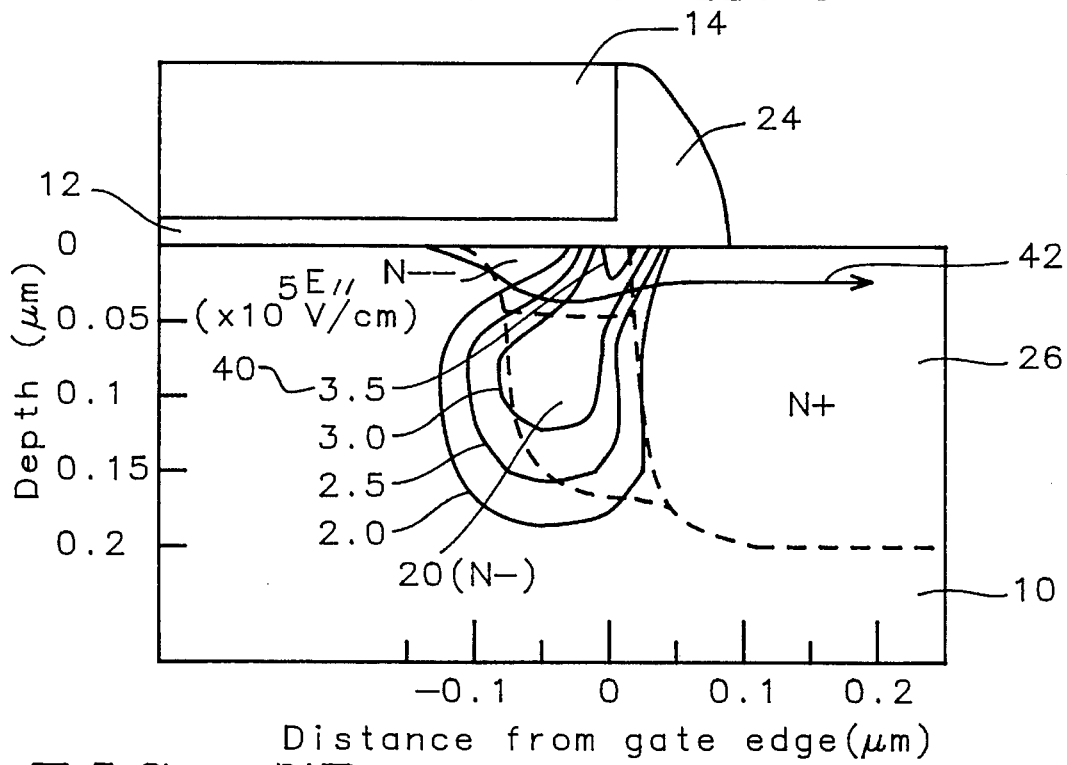
FIG. 7B schematically represents in cross-sectional representation a lightly doped drain of the present invention.

FIG. 7A and 7B illustrate the simulated contours of lateral electric field $E_{//}$, and paths of saturation current, $I_{dsat}$, for a LATID process and the surface counter-doped (SCD) lightly doped drain structure of the present invention, respectively, under bias of $V_{ds}$=5 volts and $V_{gs}$=2 volts. Both figures show a polysilicon gate 14, gate oxide 12, N+ lightly doped drain region 26, and N– lightly doped drain region 20. As shown in these figures, the minimum $E_{//}$ contour is $2 \times 10^5$ volts/cm, with an increment of $0.5 \times 10^5$ volts/cm up to $3.5 \times 10^5$ volts/cm. Note that in FIG. 7B for a SCD-lightly doped drain structure, the lateral electric fields $E_{//}$ near the corner of the gate edge are reduced and suppressed deeper into the substrate, forming a pocket-like contour. The maximum $E_{//}$ for this structure, 40, locates at the channel surface close to the edge of the gate, resulting from steeper concentration change at the N—— layer/N+ drain, 22/26. In contrast, for the LATID structure of the prior art, the maximum $E_{//}$ 40 locates under the gate oxide 12 as shown in FIG. 7A.

Even though the maximum $E_{//}$ 40 of the SCD-lightly doped drain structure (FIG. 7B) occurs near the channel surface, it is small in dimension (30 nanometers) and next to the N+ drain. Accordingly, the thin oxide spacer 24 would not be degraded with such a fully overlapped N lightly doped drain/gate structure. In addition, with the SCD-lightly doped drain structure, the current is conducted downward as a result of a higher resistance of surface N— layer. Because the current path of $I_{dsat}$ 42 is separated from the maximum $E_{//}$ 40 near the channel surface, the SCD-lightly doped drain configuration reduces hot carrier generation from impact ionization along the current path and lowers hot carrier injection from deeper regions.

Figure 8:
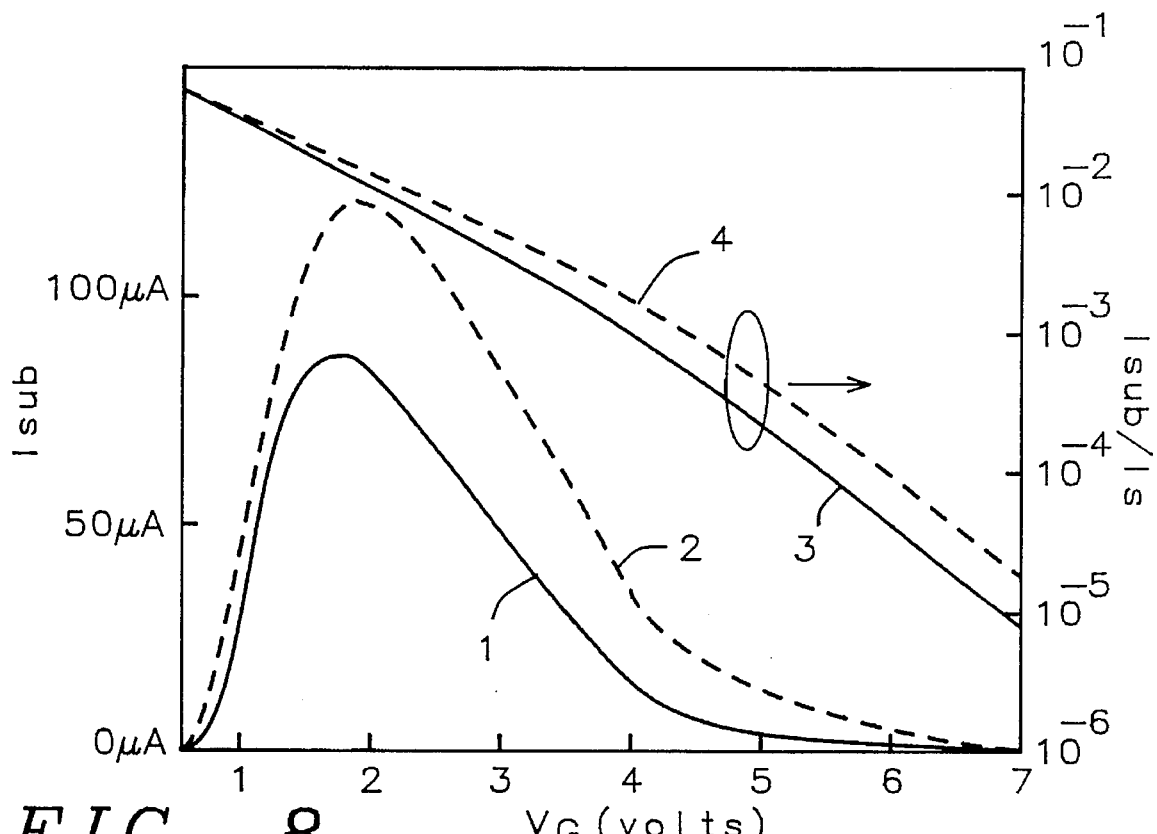
FIG. 8 graphically represents the substrate current voltage characteristics of lightly doped drains of the prior art and of the present invention.

Referring to FIG. 8, there is shown the measured substrate current and its ratio to source current for both the controlled LATID process and the surface counter-doped lightly doped source and drain process of the present invention. The substrate current is caused by impact ionization in the high electric field near the drain; therefore, it is an indicator of impact ionization of a device. Line 1 shows the substrate current of the SCD-lightly doped source and drain process of the invention and Line 2 shows the substrate current of the LATID process. The graph shows that the SCD-lightly doped source and drain process has a reduced impact ionization compared to the LATID process. The ratio of the substrate current to source current is an indicator of electric field. Line 3 shows the ratio for the SCD-lightly doped source and drain process of the invention and Line 4 shows the ratio for the LATID process. The steeper slope of the SCD-lightly doped source and drain process (line 3) implies that there is a smaller effective maximum electric field for the SCD-lightly doped source and drain process than there is for the LATID process.

The ratio of the substrate current to the source/drain saturation current decreases significantly as the result of reduced impact ionization. The saturation current is slightly reduced by this process, but this decrease can be resolved by increasing the dosage and/or the energy of the N-implant. Consequently, the interface damages and oxide trapped charges from hot carrier injection are suppressed. By using the surface counter-doped lightly doped drain structure of the present invention, the reliability is improved by 3 to 5 times over that of the controlled LATID process.

The following Examples are given to show the important features of the invention and to aid in the understanding thereof and variations may be made by one skilled in the art without departing from the spirit and scope of the invention.

EXAMPLES

The TSUPREM-IV by Technology Modeling Associates, Inc. was adopted to simulate the two-dimensional doping profiles of implanted species under the gate edge. An increase of 0.05 to 0.08 micrometers effective channel length of the surface counter-doped lightly doped drain (SCD-lightly doped source and drain) over the controlled LATID process were observed which are presumably due to the $BF_2$ implant above the N– lightly doped source and drain surface. Threshold voltages of SCD-lightly doped source and drain are 20 to 40 millivolts higher than LATID's. This is due to the longer effective channel length and the lower surface concentration on the N—— layer under the corner of the gate electrode. The punchthrough voltages of width 50 micrometers and effective length 0.35 micrometers of the SCD-lightly doped source and drain and LATID's are 10.9 and 10.6 volts, respectively. Therefore, there were found no significant influences of the additional $BF_2$ implantation on punchthrough voltages. Table I compares current voltage characteristics of SCD-lightly doped source and drain and LATID's with width 50 micrometers and effective length 0.35 micrometers, as obtained from simulation by TSUPREM-IV.

TABLE I

| $BF_2$ Implant Energy | 20 Kev | 30 Kev | 40 Kev | LATID |
| --- | --- | --- | --- | --- |
| $I_{dsat}$ (mA) | 24.56 | 24.23 | 22.99 | 24.89 |
| Gm (mA/V) | 1.2E-03 | 1.07E-03 | 1.03E-03 | 1.14E-03 |
| $I_{sub}$ (uA) | 102.3 | 90.07 | 79.2 | 113.2 |
| $I_{sub}/I_{dsat}$ (uA/mA) | 4.165 | 3.717 | 3.445 | 4.548 |

The dosage of the $BF_2$ implant is the same in each case—3 E 13 ions/cm$^2$ and the tilt angle is 60°. The controlled LATID phosphorus implant has the same dosage 3 E 13 ions/cm$^2$ and the tilt angle is 30°. Compared with the controlled LATID, the source/drain saturation currents $I_{dsat}$ (at 5 volts) of the SCD-lightly doped drain decrease 1.3%, 2.7%, and 7.6% as the $BF_2$ implant energies are 20, 30, and 40 Kev, respectively. The large tilt angle $BF_2$ implant at the surface of the N– lightly doped source and drain lowers surface concentration of N– lightly doped source and drain and increases resistance slightly. The higher energy $BF_2$ implant increases resistance on the upper layer of the N– drain region; therefore, $I_{dsat}$ decreases with increasing $BF_2$ implant energy beyond 40 Kev.

The reductions of maximum transconductance, Gm, are accounted for by the same reasons as the decreasing $I_{dsat}$. Although the $I_{dsat}$ of the SCD-lightly doped source and drain decreased slightly due to the additional resistances above the N– region, the ratios of $I_{sub}/I_{dsat}$ were reduced significantly as the $BF_2$ implant energies increased. The decrease of $I_{sub}/I_{dsat}$ is attributed to the reduced impact ionization near the drain field with the additional $BF_2$ implant. The decrease of $I_{dsat}$ can be resolved by increasing the dosage and/or energy of the N– implant.

The peak concentrations of $BF_2$ are 1.5 E 18, 1 E 18, and 7 E 17 atoms/cm$^3$ with implant energies of 40, 30, and 20 Kev, respectively, at a tilt angle of 60° while that of phosphorus is 2 E 18 atoms/cm$^3$. This indicates the net concentrations in the range of 40 nanometers from the N– lightly doped source and drain surface under the gate edge are remarkably reduced and graded in the SCD-lightly doped source and drain. These decreases of N– surface concentrations account for the $I_{dsat}$ reductions as $BF_2$ implant energies increase. A low $I_{sub}$ means less impact ionization and results in less hot carrier damage and better reliability.

Figure 9:
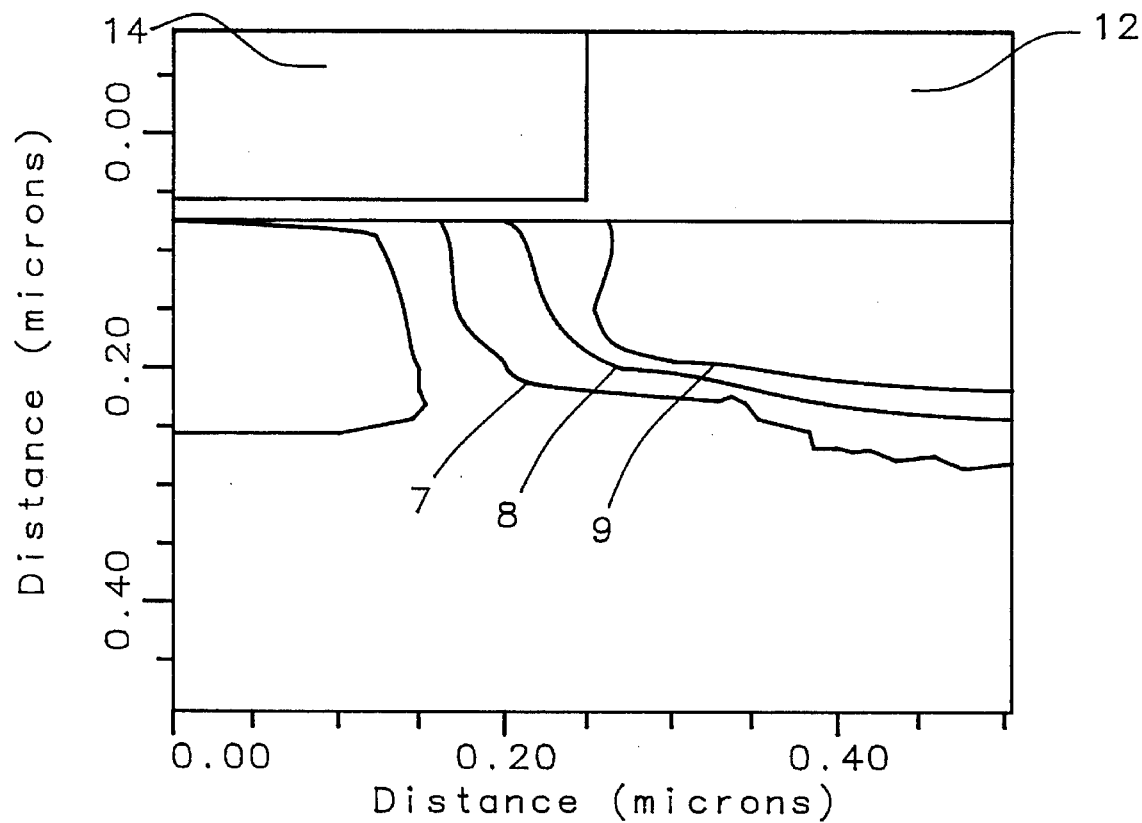
FIG. 9 graphically represents the simulated doping profiles of a lightly doped drain of the prior art.
Figure 10:
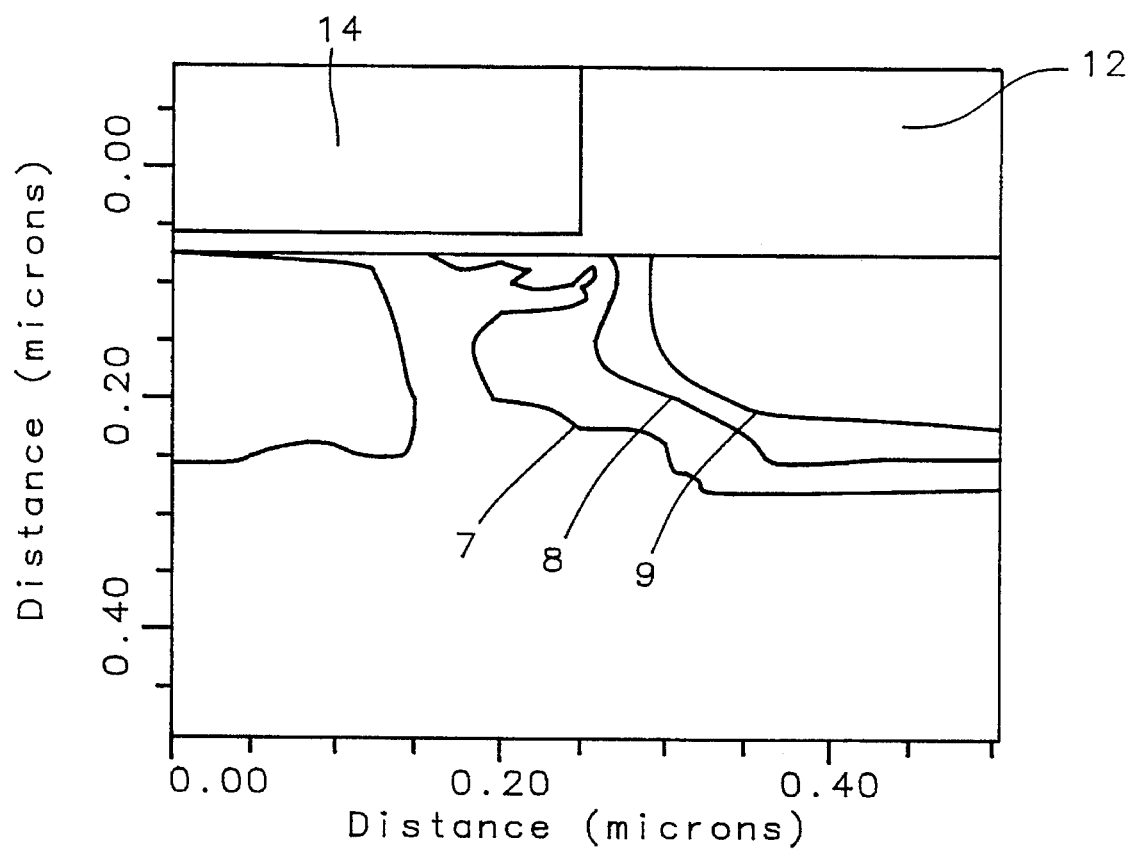
FIG. 10 graphically represents the simulated doping profiles of a lightly doped drain of the present invention.

Referring now to FIGS. 9 and 10, we see the simulated two dimensional doping profiles from the TSUPREM-IV simulator for a conventional controlled LATID process (FIG. 9) and for the process of the invention (FIG. 10). The doping profiles are shown under the gate 14 and sidewall spacer 12. Line 7 indicates the contour for a doping concentration of 1 E 17 atoms/cm$^3$ line 8, a doping concentration of 1 E 18 atoms/cm$^3$; and line 9, a doping concentration of 1 E 19 atoms/cm$^3$. In the SCD-lightly doped source and drain (FIG. 10), since the N– region is counter-doped, the net doping concentration is reduced, and therefore, the contour of line 7 is stretched out from 0.2 to 0.25 micrometers. The effective channel length is also increased by 0.05 to 0.08 micrometers because of the lower surface concentration.

Devices with width/length of 50/0.5 micrometers were stressed at the drain avalanche hot carrier injection region; that is, the maximum substrate current VD=7 or 6.5 volts, and $V_G$=2.5 volts. The threshold voltage degradation of the SCD-lightly doped source and drain was remarkably lower than that of the controlled LATID's which implies that the trapped charges in oxide of the SCD-lightly doped source and drain's were fewer. From the degradation of transconductance, it was found that there was not only lower degradation in the SCD-lightly doped source and drain's, but also a smaller rate of degradation as compared with the controlled LATID's. The lower degradations of current voltage characteristics of the surface counter-doped lightly doped drains of the present invention (SCD-lightly doped source and drain's) were considered to result from the following: 1) the lower maximum lateral electric field region, 2) the lower impact ionization near the drain, and 3) the longer hot carrier injection length along the silicon/ silicon oxide interface significantly reduced hot carrier injection probability and, in turn, interface damages.

The preferred LATID process variables were found to be an implant phosphorus dosage of between about 2.5 E 13 to 3.4 E 13 atoms/cm$^2$, depending on the channel length and substrate doping design, at an energy of 50 to 60 Kev and a tilt angle of 30° to 45° . For the SCD-lightly doped source and drain process, the dosage of $BF_2$ should be less than or equal to that of the LATID process. Energy should be 30 to 40 Kev at a tilt angle of 30° to 45°.

While the invention has been particularly shown and described with reference to the preferred embodiments thereof, it will be understood by those skilled in the art that various changes in form and details may be made without departing from the spirit and scope of the invention.

What is claimed is:

1. The MOS field effect transistor device comprising:

a gate electrode on the surface of a semiconductor substrate;

ultra thin silicon oxide spacers on the sidewalls of said gate electrode;

buried N– lightly doped source and drain regions within said semiconductor substrate underlying the edges of said gate electrode;

N— very lightly doped source and drain regions within said semiconductor substrate underlying the edges of said gate electrode and directly overlying said N– lightly doped source and drain regions wherein said N— very lightly doped source and drain region appear nowhere else within said semiconductor substrate; and N+ heavily doped source and drain regions within said semiconductor substrate adjacent to said N– lightly doped source and drain regions and said N— very lightly doped source and drain regions.

2. The device of claim 1 wherein the length of said gate electrode is between about 0.1 to 5 micrometers.

3. The device of claim 1 wherein each of said ultra thin spacers is between about 500 to 1500 Angstroms in width.

4. The device of claim 1 wherein said N+ heavily doped source and drain regions comprise Arsenic ions.

5. The device of claim 1 wherein said N– lightly doped source and drain regions comprise phosphorus ions with a peak surface concentration of about 2 E 18 atoms/cm$^3$.

6. The device of claim 1 wherein said N— very lightly doped source and drain regions comprise $BF_2$ ions with a peak surface concentration of between about 7 E 17 to 1.5 E 18 atoms/cm$^3$.

7. The device of claim 1 wherein the maximum electric field of said transistor is located at the top surface of said N— very lightly doped drain region close to the edge of said gate electrode and wherein the current path is separated from said maximum electric field of said transistor.

8. The MOS field effect transistor device comprising:

a gate electrode on the surface of a semiconductor substrate, said gate electrode having a length of between about 0.1 to 5 micrometers;

ultra thin silicon oxide spacers on the sidewalls of said gate electrode wherein each of said ultra thin oxide spacers has a width of between about 500 to 1500 Angstroms;

buried N– lightly doped source and drain regions within said semiconductor substrate underlying the edges of said gate electrode;

N— very lightly doped source and drain regions within said semiconductor substrate underlying the edges of said gate electrode and directly overlying said N– lightly doped source and drain regions wherein said N— very lightly doped source and drain regions appear nowhere else within said semiconductor substrate and wherein the maximum electric field of said transistor is located at the top surface of said N— very lightly doped drain region close to the edge of said gate electrode and wherein the current path is separated from said maximum electric field of said transistor; and N+ heavily doped source and drain regions within said semiconductor substrate adjacent to said N– lightly doped source and drain regions and said N— very lightly doped source and drain regions.

9. The device of claim 8 wherein said N+ heavily doped source and drain regions comprise Arsenic ions.

10. The device of claim 8 wherein said N– lightly doped source and drain regions comprise phosphorus ions with a peak surface concentration of about 2 E 18 atoms/cm$^3$.

11. The device of claim 8 wherein said N— very lightly doped source and drain regions comprise BF$_2$ ions with a peak surface concentration of between about 7 E 17 to 1.5 E 18 atoms/cm$^3$.

* * * * *